(12) United States Patent
Refai-Ahmed et al.

(10) Patent No.: US 7,570,490 B2
(45) Date of Patent: Aug. 4, 2009

(54) VARIABLE SPRING RATE THERMAL MANAGEMENT APPARATUS ATTACHMENT MECHANISM

(75) Inventors: Gamal Refai-Ahmed, Markham (CA); Robert Wiley, Topsfield, MA (US); Steven Chan, Richmond Hill, CA (US); Nima Osqueizadeh, Richmond, CA (US); Salim Lakhani, Toronto (CA)

(73) Assignee: ATI Technologies ULC, Markham, Ontario (CA)

( * ) Notice: Subject to any disclaimer, the term of this patent is extended or adjusted under 35 U.S.C. 154(b) by 109 days.

(21) Appl. No.: 11/162,163

(22) Filed: Aug. 31, 2005

(65) Prior Publication Data

US 2007/0047211 A1 Mar. 1, 2007

(51) Int. Cl.
*H05K 7/20* (2006.01)
*F25D 23/00* (2006.01)

(52) U.S. Cl. .................. 361/719; 361/704; 361/720; 165/80.3; 165/104.33; 165/185; 174/16.3

(58) Field of Classification Search ................ 361/687, 361/704, 719–721, 816; 257/712–719; 165/80.2, 165/80.3, 185; 174/15.1, 16.3, 252, 260; 248/505, 510; 29/739, 740, 832, 845; 24/453, 24/457, 458
See application file for complete search history.

(56) References Cited

U.S. PATENT DOCUMENTS

| 5,662,163 | A | | 9/1997 | Mira | |
|---|---|---|---|---|---|
| 5,932,925 | A | * | 8/1999 | McIntyre | 257/719 |
| 6,151,214 | A | * | 11/2000 | Yeh | 361/695 |
| 6,356,446 | B1 | | 3/2002 | Guerrero | |
| 6,504,712 | B2 | * | 1/2003 | Hashimoto et al. | 361/687 |
| 6,714,414 | B1 | * | 3/2004 | Dubovsky et al. | 361/704 |
| 7,095,614 | B2 | * | 8/2006 | Goldmann | 361/704 |
| 7,170,750 | B2 | * | 1/2007 | Tanaka | 361/719 |
| 7,190,586 | B2 | * | 3/2007 | Franz et al. | 361/704 |
| 7,190,591 | B2 | * | 3/2007 | Peng et al. | 361/719 |
| 7,193,854 | B2 | * | 3/2007 | Bonomo et al. | 361/719 |
| 2005/0061477 | A1 | | 3/2005 | Mira | |
| 2006/0114657 | A1 | * | 6/2006 | Refai-Ahmed et al. | 361/719 |

* cited by examiner

*Primary Examiner*—Michael V Datskovskiy
(74) *Attorney, Agent, or Firm*—Vedder Price P.C.

(57) ABSTRACT

A device to thermally couple a thermal management apparatus to at least one heat generating component of a circuit substrate includes at least a first portion that is adapted to couple to the thermal management apparatus, and at least a second portion that is adapted to couple to the thermal management apparatus. The first portion and the second portion may be symmetrically arranged relative to each other. The first portion and the second portion are adapted to thermally couple the thermal management apparatus to the heat generating component with a first spring bias. The first portion and the second portion are further adapted to maintain the thermal management apparatus thermally coupled to the heat generating component with a second spring bias.

26 Claims, 6 Drawing Sheets

VARIABLE SPRING RATE THERMAL MANAGEMENT APPARATUS ATTACHMENT MECHANISM

The present invention generally relates to thermal management apparatus attachment mechanisms, and more particularly, to a variable spring rate thermal management apparatus attachment mechanism.

BACKGROUND OF THE INVENTION

Electronic components such as integrated chips generally produce heat when operating. The heat is then transferred to an object to which the electronic component is attached and/or to the surrounding air. However, cooling solutions may be necessary for certain electronic components to maintain the operational temperature thereof below a critical temperature, which if reached, the electronic component may either not operate efficiently or fail due to heat damage.

Various known cooling solutions for such electronic components can be used. A common cooling solution is to attach a heat sink to a circuit substrate such that the heat sink is thermally coupled to the heat generating components of the circuit substrate. Accordingly, the heat sink may be either in direct contact with an outer surface of the heat generating component, or in indirect contact through an intermediate thermally conductive layer. The amount of heat conduction between the heat sink and the heat generating component may depend on the contact pressure between the heat sink and the heat generating component. To maintain the contact at a desired contact pressure, one or more spring clips are typically used to mount the heat sink to the circuit substrate such that the spring clip biases the heat sink toward the heat generating component with a desired force. The spring clip is typically mounted to the backside of the circuit substrate and coupled to the heat sink with pins or screws through corresponding apertures in the circuit substrate. Accordingly, the heat sink may not be fixedly attached to the circuit substrate, but only maintained on the circuit substrate by the biasing force of the spring clip. The spring clip has a spring rate that provides sufficient contact pressure between the heat sink and the various heat generating components of a circuit substrate. However, the spring rate cannot be too high so as to put excessive pressure on the heat generating components. Such excessive pressure may damage some or all of the heat generating components.

Circuit assemblies that include a circuit substrate and a heat sink are susceptible to damage due to shock and vibration. In particular, because the heat sink may not be fixedly attached to the circuit substrate and be only maintained by the spring clip, any shock or vibration will cause the heat sink to correspondingly react relative to the heat generating components with which it contacts. Such reaction may cause a recoil of the heat sink against the heat generating components thereby causing damage to the heat generating components.

Therefore, there is a need for a device that can maintain a thermal management apparatus in a desired contact with heat generating components of a circuit substrate, while preventing the thermal management apparatus to damage the heat generating components during shock or excessive vibration events.

BRIEF DESCRIPTION OF THE DRAWINGS

The features of the present invention which are believed to be novel are set forth with particularity in the appended claims. The invention may best be understood by reference to the following description taken in conjunction with the accompanying drawings, and the several figures of which like reference numerals identify like elements.

DETAILED DESCRIPTION OF A PREFERRED EMBODIMENT

The present disclosure relates to a device to thermally couple a thermal management apparatus to at least one heat generating component of a circuit substrate. The device includes at least a first portion that is adapted to couple to the thermal management apparatus, and at least a second portion that is adapted to couple to the thermal management apparatus. The first portion and the second portion may be symmetrically arranged relative to each other. The first portion and the second portion are adapted to thermally couple the thermal management apparatus to the heat generating component with a first spring bias. The first portion and the second portion are further adapted to maintain the thermal management apparatus thermally coupled to the heat generating component with a second spring bias.

Referring to FIGS. 1-5, a device 20 to thermally couple a thermal management apparatus 22 (shown in FIGS. 4 and 5) to at least one heat generating component 24 of a circuit substrate 26 (shown in FIGS. 4 and 5) is shown. The device 20 includes at least a first portion 30 and at least a second portion 32 that can couple to the thermal management apparatus 22. The first portion 30 and the second portion 32 can thermally couple the thermal management apparatus 22 to the heat generating component 24 with a first spring bias. The first portion 30 and the second portion 32 can also maintain the thermal management apparatus 22 thermally coupled to the heat generating component 24 with a second spring bias. The first portion 30 and the second portion 32 are configured to provide a symmetrically balanced first spring bias and second spring bias on the thermal management apparatus 22.

Figure 1:
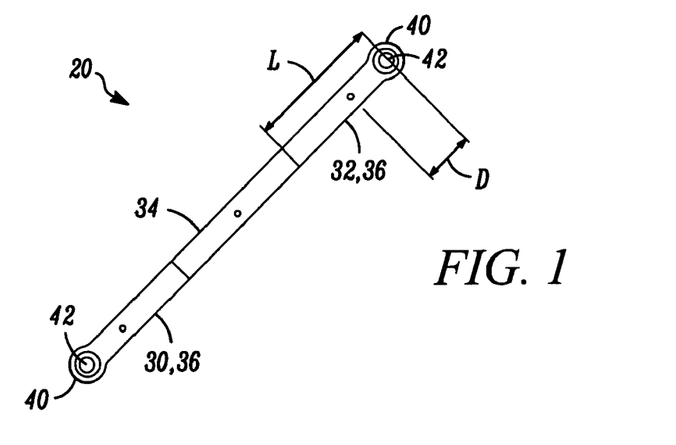
FIG. 1 is a top view of a backside of an exemplary variable spring rate thermal management apparatus constructed in accordance with the present disclosure.
Figure 2:
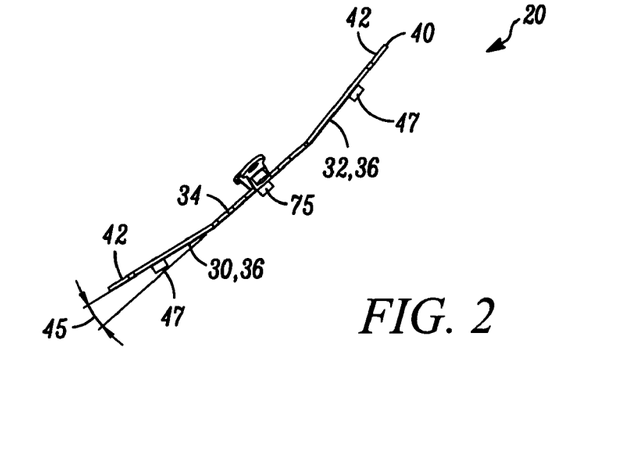
FIG. 2 is a side view of the apparatus of FIG. 1.

The first portion 30 and the second portion 32 can be contiguous to form a single-piece device 20. The device 20 may also include a center portion 34 between the first portion 30 and the second portion 32. Accordingly, the first portion 30 and the second portion 32 can be joined to or integral with the center portion 34 to form a pair of arms that extend outward from the center portion 34. The first portion 30, the second portion 32 and the center portion 34 can be constructed from a single piece of material that has elastic or spring-like properties. For example, the device 20 can be manufactured from a single molded piece of plastic, cut out from a thin metal plate, or formed from any suitable material. Because the first portion 30 and the second portion 32 extend outward relative to each other and may be extending outward from the center portion 34, the first portion 30 and the second portion 32 will be referred to herein as the arms 36. Therefore, the first portion 30 can be considered as an arm 36 that extends outward from the center portion 34, and the second portion 32 can be considered as another arm 36 that extends outward from the center portion 34. However, the arms 36 may have different size, shape, and other characteristics, yet provide a balanced biasing force. For example, the first portion 30 may be thicker and shorter than the second portion 32. In another example, the first portion 30 may have a different shape than the second portion 32.

Figure 3:
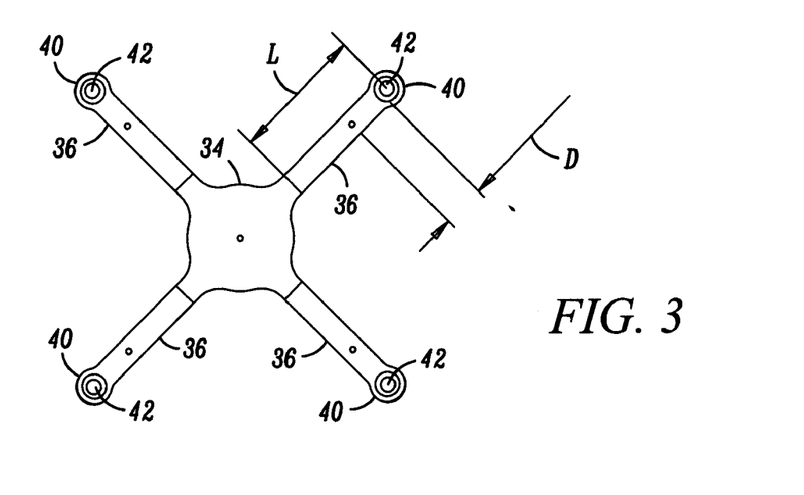
FIG. 3 is a top view of a backside of another exemplary variable spring rate thermal management apparatus constructed in accordance with the present disclosure.

The device 20 can include any number of arms 36, with each arm 36 being adapted to couple to the thermal management apparatus 22. Referring to FIG. 3, another example of the device 20 is shown that includes four arms 36 that extend outward from the center portion 34 and are symmetrically positioned relative to the center portion 34. Therefore, a device 20 having a plurality of arms 36, such as six, eight or even ten arms 36 can be constructed in accordance with the teachings of the present disclosure. Each arm 36 includes an end 40 that is adapted for coupling to the thermal management apparatus 22. In the disclosed examples, each end 40 includes an aperture 42 that can receive a fastener 43 (shown in FIGS. 4 and 5), and as will be described in the following, each end 40 can be connected with the fastener 43 to the thermal management apparatus 22.

The first spring bias may be provided by the deflection of the arms 36 from a free state configuration. Referring to FIG. 2, the free state configuration of the arms 36 is shown as an offset angle 45 of each arm 36 relative to a plane that defines the center portion 34. When the arms 36 are deflected to reduce the offset angle 45, the first spring rate is defined by the bias in the arms 36 in maintaining the offset angle 45 of the free state configuration if the arms 36 are deflected. Therefore, each arm 36 functions as a leaf spring when deflected to provide the first spring rate. The second spring rate is provided when a portion of each arm 36 is pressed against a protruding member 47. The protruding member 47 functions as a pivot or a fulcrum to change the spring characteristics of the arm 36 from the first spring rate to the second spring rate. Each protruding member 47 may be an integral part of a corresponding arm 36, moveably mounted on the corresponding arm 36, mounted on a circuit substrate that utilizes the device 20, or be an integral part of the circuit substrate that utilizes the device 20.

Figure 4:
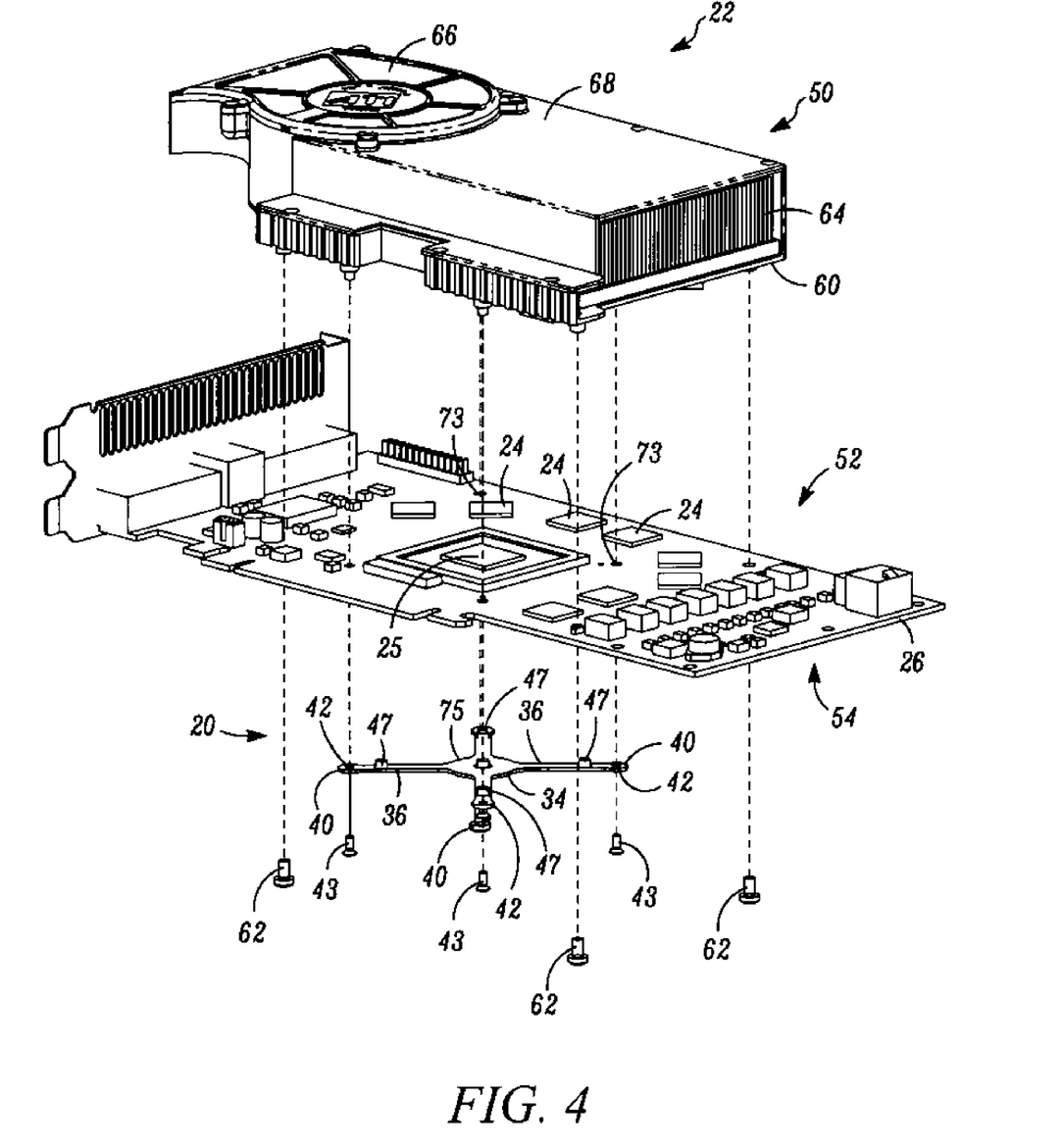
FIG. 4 is a perspective exploded view of a circuit assembly using the apparatus of FIG. 3.
Figure 5:
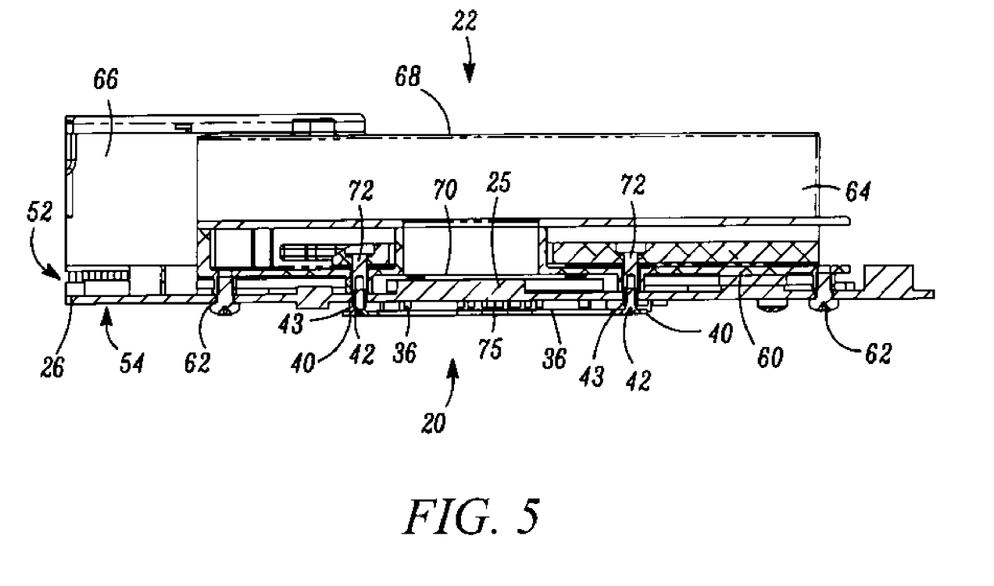
FIG. 5 is a side cross sectional view of the circuit assembly of FIG. 4.

Referring to FIGS. 4 and 5, a circuit assembly 50 that utilizes the device 20 in accordance with the teachings of the present disclosure is shown. In FIGS. 4 and 5, the device 20 having four arms 36 is shown and described. However, as described herein, the device 20 can have as few as two arms 36 or more than two arms 36. The circuit assembly 50 includes the circuit substrate 26, which may be a printed circuit board or any suitable structure for performing the functions of the circuit substrate 26. The circuit substrate 26 may include a plurality of heat generating components 24 that may include analogue, digital, and/or optical circuits. The plurality of heat generating components 24 may include a primary heat generating component, such as a central processing unit, and other heat generating components that provide support for the primary heat generating component and perform other functions of the circuit assembly 50. In the following, the operation of the device 20 is described with respect to a single heat generating component 25. However, the device 20 can operate to couple the thermal management apparatus 22 to any number and type of heat generating components of a circuit substrate.

The thermal management apparatus 22 can be mounted on a front side 52 of the circuit substrate 26 so as to thermally couple to the heat generating component 25. Thermal management apparatus 22 can include a portion that is fixedly attached to the circuit substrate 26, and a floating portion that thermally couples to the heat generating components 25. The floating portion may be mounted and supported on the circuit substrate 26 with the device 20 from the backside 54 of the circuit substrate 26. The thermal management device 22 may also be fully floating such that it is supported by the device 20. In the following, operation of the device 20 will be described with the thermal management apparatus 22 having both a fixed portion and a floating portion. However, one of ordinary skill in the art will appreciate that the device 20 can be used with any circuit assembly 50 having any type of thermal management apparatus 22 that couples to one or a plurality of heat generating components 25.

Referring to FIGS. 4 and 5, the thermal management apparatus 22 may include a tray 60 that is fixedly attached to the front side 52 of the circuit substrate 26 with tray fasteners 62. The tray fasteners 62 engage the tray 60 from the backside 54 of the circuit substrate 26 through a plurality of corresponding apertures in the circuit substrate 26. The thermal management apparatus 22 further includes an extend heat surface 64 that is disposed on the tray 60 and can move, i.e., floats relative to the tray 60. An example of an extended heat surface 64 is a heat sink. In the disclosed examples, a heat sink is shown. Accordingly, the extended heat surface 64 is referred to herein as the heat sink 64. Additionally, the thermal management apparatus 22 may include one or more forced convection cooling devices that provide forced convection cooling for the extended heat surface, i.e., heat sink 64. The thermal management apparatus 22 is shown to include an air mover 66 disposed near the heat sink 64 so as to provide forced convection cooling to the heat sink 64. An example of an air mover is a fan, hence the air mover 66 is referred to herein a the fan 66. The entire thermal management apparatus 22 may be enclosed by an enclosure 68, which maybe fixedly attached to the tray 60.

When the tray 60 is attached to the circuit substrate 26, the heat sink 64 may be configured so that a lower portion 70 of the heat sink 64 is positioned near the heat generating component 25. Accordingly, a gap may exist between the heat generating component 25 and the lower portion 70 (shown in FIG. 5) of the heat sink 64. The gap may be filled with a thermally conductive material such as a thermally conductive foam or any such suitable material. Therefore, the lower portion 70 of the heat sink 64 may be in thermal but indirect contact with the heat generating component 25 through the thermally conductive material. To provide sufficient thermal conduction between the heat generating component 25 and the heat sink 64, the lower portion 70 should thermally couple to the heat generating component 25 with a certain amount of pressure. However, the pressure should not be excessive so as to possibly damage the heat generating component 25. Therefore, the lower portion 70 of the heat sink 64 may be biased toward the heat generating component 25 by a spring force.

To provide such a spring bias between the lower portion 70 of the heat sink 64 and the heat generating component 25, the device 20 can be coupled to the heat sink 64 from the backside 54 of the circuit substrate 26. The heat sink 64 includes a plurality of heat sink standoffs 72 that are directed toward the circuit substrate 26 and align with a plurality of corresponding apertures 73 (shown in FIG. 4) in the circuit substrate 26. The device 20 can be positioned on the backside 54 of the circuit substrate 26 such that the ends 40 of the arms 36 align with the apertures 73. To align the device 20, however, the device 20 includes a centrally disposed locator pin 75 (shown in FIGS. 2, 4 and 5) that can be inserted in a corresponding aperture on the backside 54 of the circuit substrate 26. To couple the device 20 to the heat sink 64, each fastener 43 can be inserted through the aperture 42 of the end 40 of a corresponding arm 36 and fastened to the heat sink standoff 72. By tightening the fasteners 43, each arm 36 is deflected through the free state angle 45 so that each protruding member 47 is closely positioned between a corresponding arm 36 and the back side 54 of the circuit substrate 26. The fasteners can also be tightened such that each protruding member 47 is lightly contacted by either the backside 54 of the circuit substrate 26 if the protruding member is on the arm 36, or by the arm 36 if the protruding member 47 is on the backside 54 of the circuit substrate 26. In this configuration, because each arm 36 is deflected through the free state angle 45, each arm 36 provides a first spring bias between the heat generating component 25 and the heat sink 64. The first spring bias may be a constant spring rate provided by each arm 36. The first spring rate simply provides the bias between the heat sink 64 and the heat generating component 25 so that sufficient thermal conduction is provided between the lower portion 70 of the heat sink 64 and the heat generating component 25.

Because the heat sink 64 can move relative to the tray 60 and the heat generating component 25, any shock or vibration imparted on the circuit assembly 50 may cause the heat sink 64 to correspondingly vibrate relative to the heat generating component 25. If the force that is generated by the vibration is higher than the first spring bias, the heat sink 64 may separate from the heat generating component 25. Accordingly, the ends 40 of the arms 36 at the apertures 42 will be pulled in the same direction as the heat sink 64. The movement of the ends 42 will cause each arm 36 and the corresponding backside portion of the circuit substrate 26 to press against the corresponding protruding member 47. Accordingly, the protruding member 47 provides a pivot or a fulcrum for each corresponding arm 36. Because each protruding member 47 provides a pivot point for a corresponding arm 36, each arm 36 deflects about a corresponding protruding member 47 to provide a second spring rate, which depends on the distance D (shown in FIGS. 1 and 3) between each protruding member 47 and the end 42 of the corresponding arm 36. The second spring rate may be variable and higher than the first spring rate so as to prevent the movement of the lower portion 70 of the heat sink 64 relative to the heat generating component 25. The variability of the second spring rate will provide a variable spring force based on the magnitude of the movement of the heat sink 64 relative to the heat generating component 25. Accordingly, if the heat sink 64 moves relative to the heat generating component 25, the device 20 can substantially curtail the movement of the heat sink 64 relative to the heat generating component 25 by having the second spring rate. Therefore, the heat sink 64 will not violently impact the heat generating component 25 upon any shock or vibration imparted on the circuit assembly 50.

The second spring rate of the device 20 depends on the distance D relative to the length L (shown in FIGS. 1 and 3) of each arm 36. In the disclosed examples, the distance D is shown to be one-third the length L of each arm 36, i.e., $D = \frac{1}{3}L$. Accordingly, the second spring rate is a cubic spring rate, meaning that any movement of the heat sink 64 relative to the heat generating component 25 will cause the device 20 to bias the heat sink 64 toward the heat generating component 25 by a force that is proportional to a cube of the distance of the movement. If a higher variable spring rate than a cubic spring rate is desired, the protruding members 47 can be positioned closer to the ends 42 of each arm 36 than shown in FIGS. 1 and 3. In contrast, if a lower variable spring rate is desired, the protruding members 47 can be placed farther away from the ends 40 of each arm 36 than shown in FIGS. 1 and 3.

Figure 6:
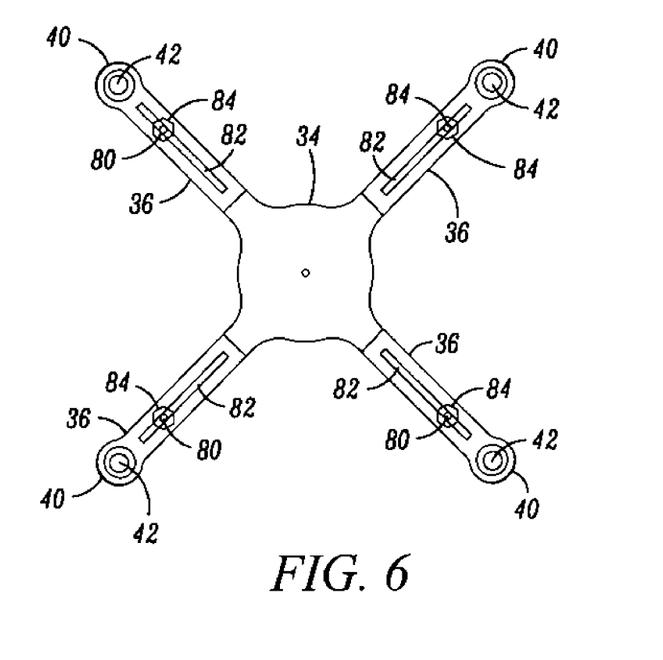
FIG. 6 is a top view of a backside of another exemplary variable spring rate thermal management apparatus constructed in accordance with the present disclosure.

Referring to FIG. 6, the device 20 may include a mechanism for adjusting the distance D of the protruding members 47 to provide an adjustable second spring rate. Each protruding member 47 can include a pin 80 and each of the arms 36 can include a slot 82 that receives the pin 80 of a corresponding protruding member 47. The pin 80 may engage the slot 82 frictionally so as to maintain its position at the distance D once the pin 80 is placed in the slot 82. Accordingly, to move the pin 80 to another position, a user can physically move the protruding member 47 along the slot 82 against the frictional force between the pin 80 and the slot 82. The pin 80 may also be secured in a desired position by being secured to the slot 82 by a fastener 84. For example, the pin 80 may be threaded to engage a correspondingly counter-threaded nut 84. Accordingly, once the nut 84 is tightened on the pin 80, the protruding member 47 will maintain its position on the arm 36.

Figure 7:
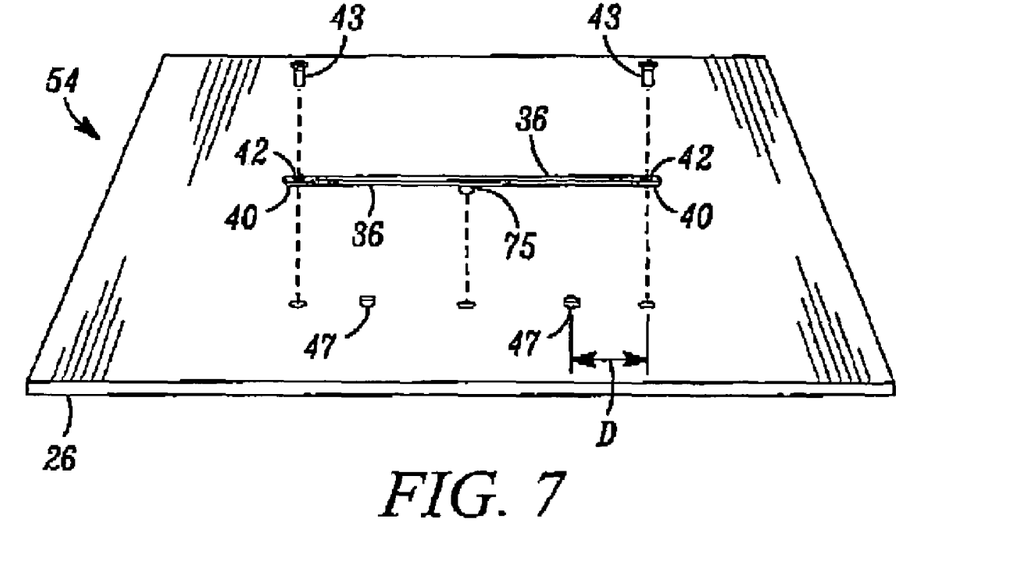
FIG. 7 is an exploded view of another exemplary variable spring rate thermal management apparatus and a corresponding circuit substrate constructed in accordance with the present disclosure.
Figure 8:
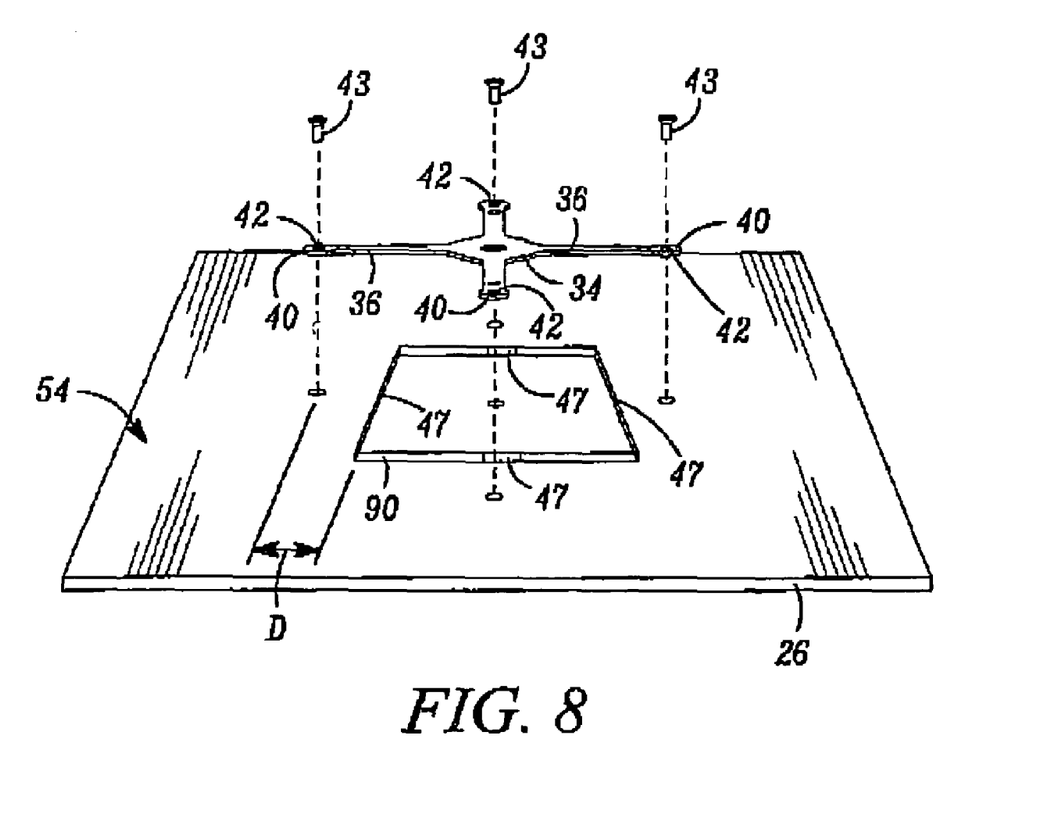
FIG. 8 is an exploded view of another exemplary variable spring rate thermal management apparatus and a corresponding circuit substrate constructed in accordance with the present disclosure.

Referring to FIGS. 7 and 8, the protruding members 47 may be an integral part of or be mounted to the back side 54 of the circuit substrate 26. In FIG. 7, the protruding members 47 are shown to be on the back side 54 of the circuit substrate 26 at the distance D from where the end 42 of the corresponding arm 36. Accordingly, a protruding member 47 may be provided on the backside 54 of the circuit substrate 26 for each arm 36 of the device 20. Alternatively, as shown in FIG. 8, a frame 90 can be attached to the backside 54 of the circuit substrate 26 that can provide the function of the protruding members 47. The frame 90 can be positioned on the backside 54 of the circuit substrate 26 relative to the device 20 such that portions of the frame 90 function as the protruding members 47. The frame 90 may be rectangular, circular, or have any suitable shape to provide the function of the protruding members 47 as described herein. When the protruding members 47 are attached to the circuit substrate 26 or provided with the frame 90, the second spring rate can be varied by adjusting the size and/or shape of the frame 90.

Figure 9:
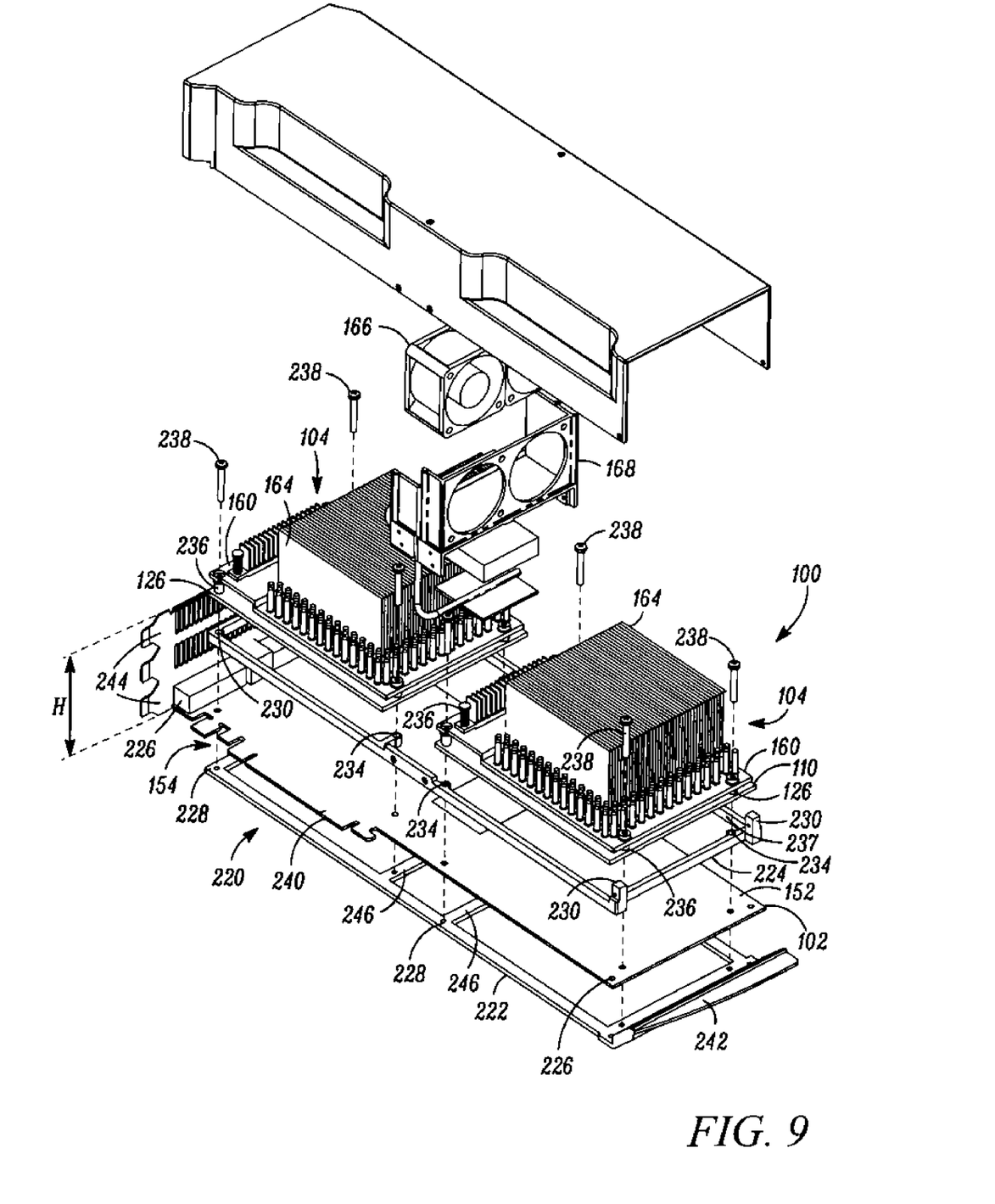
FIG. 9 is an exploded view of another circuit assembly having a support structure and a variable spring rate thermal management apparatus constructed in accordance with the present disclosure.
Figure 10:
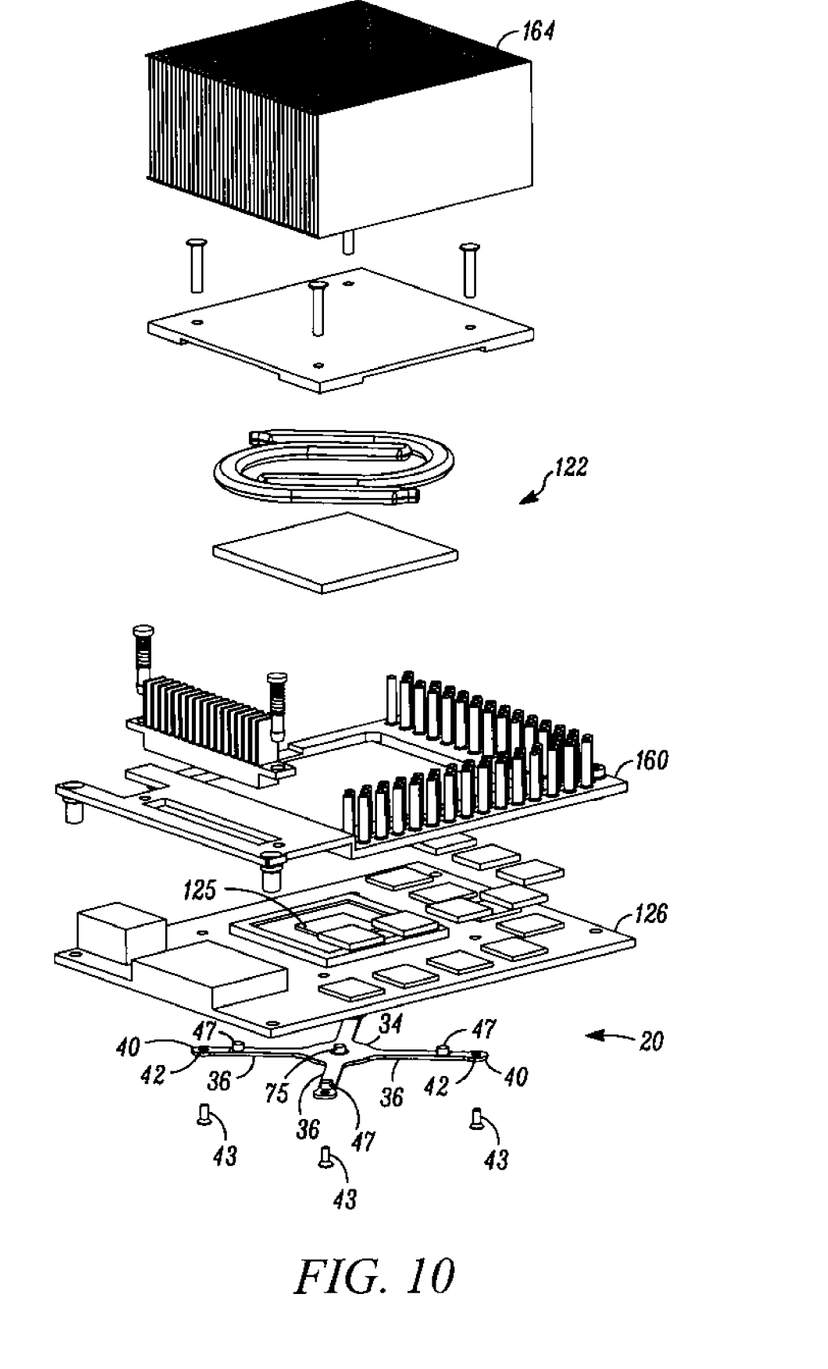
FIG. 10 is an exploded view of a circuit sub-assembly of the circuit assembly of FIG. 9.

Referring to FIG. 9, another circuit assembly 100 constructed in accordance with teachings of the present disclosure is shown. The circuit assembly 100 includes a circuit sub-substrate 102 upon which one or more circuit sub-assemblies 104 are mounted. Referring to FIG. 10, each circuit sub-assembly 104 is in many respects similar to the circuit assembly 50 of FIGS. 4 and 5. Each circuit sub-assembly 104 includes a circuit substrate 126 that includes at least one heat generating component 125, a thermal management apparatus 122, and the device 20 to couple the thermal management apparatus 122 to the heat generating component 125.

The thermal management apparatus 122 is shown in FIG. 10 to include a tray 160 that can be fixedly attached to the circuit substrate 126 and an extended heat surface 164 that is disposed on the tray 160 and can move relative to the tray, i.e., floats relative to the tray 160. An example of an extended heat surface 164 is a heat sink. In the disclosed examples, a heat sink is shown. Accordingly, the extended heat surface 164 is referred to herein as the heat sink 164. As described in the foregoing with respect to the circuit assembly 50, the device 20 provides a first spring bias and second spring bias in thermally coupling the heat sink 164 with the heat generating component 125. The coupling of the device 20 with the heat sink 164 and the operating of the device 20 is described in detail in the foregoing and will not be repeated herein with respect to the circuit assembly 100. Referring to FIG. 9, each circuit sub-assembly 104 may include an air mover 166 that provides convection cooling for the heat sink 164. An example of an air mover is a fan, hence the air mover 166 will be referred to herein as the fan 166. As shown in FIG. 9, the circuit assembly 100 includes two circuit sub-assemblies 104. Disposed between the circuit sub-assemblies 104 is a pair of fans 166, with each fan 166 providing convection cooling to a corresponding heat sink 164. The fans 166 may be housed in a fan cage 168, which is mounted between the two circuit sub-assemblies 104.

Because one or more of the circuit sub-assemblies 104 may be mounted on the circuit substrate 102, the weight of the circuit sub-assemblies 104 may bend the circuit substrate 102 or impart excessive loads on the circuit substrate 102 that may result in damage or malfunction to the circuit assembly 100. Referring to FIG. 9, to provide structural support for the circuit substrate 102 and to provide a rigid support for the circuit sub-assemblies 104, the circuit assembly 100 includes a support apparatus 220 that may be attached to the circuit substrate 102 to provide rigidity and structural support for the circuit substrate 102. The support apparatus 220 may take any shape or form and be mounted anywhere on the circuit substrate 102 so long as it provides rigidity and support for the circuit substrate 102 when one or more of the circuit sub-assemblies 104 are mounted thereto. In the disclosed example, the support apparatus 220 includes a first support structure 222 that is mounted to the backside 154 of the circuit substrate 102 and a second support structure 224 that is mounted to the front side 152 of the circuit substrate 102. Because the circuit substrate 102 is generally rectangular, both the first support structure 222 and the second support structure 224 are also rectangular and configured to mount substantially near the perimeter of the circuit substrate 102. Accordingly, the first support structure 222 and the second support structure 224 may be configured as frames.

The circuit substrate 102 may include a plurality of apertures 226 that align with a plurality of corresponding apertures 228 and 230 on the first support structure 222 and the second support structure 224, respectively. Accordingly, the first support structure 222, the circuit substrate 102, and the second support structure 224 can all attach together by having fasteners extending through the apertures 228, 226 and 230, respectively, and fastened. By the first support structure 222 and the second support structure 224 being attached to the circuit substrate 102 and together, any loads including bending loads that are imparted on the circuit substrate 102 will be transferred to the first support structure 222 and the second support structure 224 and may not cause bending of the circuit substrate 102. Accordingly one or a number of circuit sub-assemblies 104 having varying weights and heights can be mounted on the circuit substrate 102 without imparting excessive loads on the circuit substrate 102.

Although the circuit sub-assembly 104 and the fans 166 can be mounted directly on the circuit substrate 102, in order to reduce the load that may be imparted upon the circuit substrate 102, the circuit sub-assemblies 104 and the fan cage 168 can be attached to the second support structure 224. The second support structure 224 can include a plurality of apertures 234 that align with corresponding apertures 236 of the circuit sub-assemblies 104 and the fan cage 168. Accordingly, the circuit sub-assemblies 104 and the fan cage 168 can be fastened to the second support structure 224 with a plurality of fasteners 238.

The circuit substrate 102 includes a connector 240 by which the circuit assembly 100 can be mounted and connected or plugged into a larger circuit substrate (not shown), such as a computer motherboard. Because of all the above-described components that are mounted on the circuit substrate 102, mainly the circuit sub-assemblies 104 and the fan cage 168, the circuit assembly 100 may be heavy and large so as to require a user to handle it properly for correct attachment of the connector 240 to the motherboard. In other words, because of the size and weight of the circuit assembly 100, the user may not be able to hold any of the above-described components of the circuit assembly 100 to lift or move the circuit assembly 100 because such holding of any component may cause damage to the circuit assembly 100.

Referring to FIG. 9, the circuit assembly 100 may be heavy and may have a height H as shown in FIG. 9, such that it may occupy several typical expansion slots of a computer motherboard. To provide a mechanism by which the circuit assembly 100 can be transported and manipulated by an operator, the support apparatus 220 includes a handle 242 that may be an extension of the first frame 222. The handle 242 may be planar relative to the first support structure 222. Furthermore, the handle 242 may function as a stiffening member for the support apparatus 220. Therefore an operator can simply move, lift or manipulate in other ways the circuit assembly 100 by simply grabbing the handle 242 and back plates 244 of the circuit assembly 100 without grabbing or contacting any of the functional components of the circuit assembly 100.

The support apparatus 220 may have additional structural members that can provide stiffness thereto. For example, as shown in FIG. 9, the first support structure 222 can include one or more stiffeners 246 that can provide additional stiffening to the first support structure 222. Both the first support structure 222 and the second support structure 224 may be constructed from metals, plastics or other like rigid materials. In the disclosed example, the first support structure 222 is constructed from aluminum to provide sufficient rigidity to the support apparatus 220. However, to provide electrical insulation for the circuit substrate 102 and all of the above-described components that are in electrical contact with the circuit substrate 102, the second support structure 224 may be constructed from a rigid plastic. In addition to providing electrical insulation, the second support structure 224 can be molded in a variety of shapes and configurations so as to provide various receiving and support portions for any corresponding component of the circuit assembly 100. For example, the inner perimeter of the second support structure 224 can be molded so as to receive the circuit sub-assembly 104 such that the circuit sub-assembly 104 fits snuggly in the second support structure 224. In yet another example, the center portion of the second support structure 224 can be molded in a shape that matches the shape of the bottom portion of the fan cage 168 so that the fan cage 168 can be mounted on the second support structure 224 so as to sit in the second support structure 224.

As described in the foregoing, each circuit sub-assembly 104 may utilize one of the devices 20 so as to provide thermal coupling between the heat sink 164 and the heat generating components of each circuit sub-assembly 104. Accordingly any shock or vibration imparted on the circuit assembly 100 may be ultimately transferred to the devices 20 so as to prevent damage to the heat generating components of each circuit sub-assembly 104.

Therefore the circuit assembly 100 of the present disclosure provides rigidity for the circuit substrate 102 so that one or more circuit sub-assemblies 104 can be mounted thereto, in addition to the use of the device 20 so as to protect heat generating components of each circuit sub-assembly 104 should any shock or vibration be imparted on the circuit assembly 100.

The invention is not limited to particular details of the apparatus and method depicted and the modifications and applications may be contemplated. Certain other changes may be made in the above-described method and apparatus without departing from the true spirit of the scope of the invention herein involved. It is intended, therefore, that the subject matter in the above depiction should be interpreted as illustrative and not in a limiting sense.

What is claimed is:

1. A device to thermally couple a thermal management apparatus to at least one heat generating component of a circuit substrate, the device comprising:
    at least a first portion adapted to couple to the thermal management apparatus;
    at least a second portion adapted to couple to the thermal management apparatus, the first portion and the second portion symmetrically arranged relative to each other;
    wherein the first portion and the second portion are adapted to thermally couple the thermal management apparatus with the heat generating component with a first spring bias; and
    wherein the first portion and the second portion are adapted to maintain the thermal management apparatus thermally coupled with the heat generating component with a second and pivot based spring bias provided in response to deflection of the device, each of the first portion and the second portion including a protruding member at a protruding member distance from a corresponding end of the first portion and a second portion, wherein contact between the protruding members and the circuit substrate provides the second spring bias.

2. The device of claim 1, wherein the first spring bias includes a constant spring rate.

3. The device of claim 1, wherein the second spring bias includes a variable spring rate.

4. The device of claim 1, wherein the protruding member distance relative to a length of the corresponding first portion or the second portion defines the second spring bias.

5. The device of claim 4, wherein the protruding member distance is adjustable to vary the second spring bias.

6. A device to thermally couple a thermal management apparatus to at least one heat generating component of a circuit substrate, the device comprising:
    a plurality of symmetrically arranged arms, an outer end of each arm adapted to couple to the thermal management device, wherein each arm provides a first spring bias on the thermal management apparatus to thermally couple the thermal management apparatus with the heat generating component; and
    a plurality of protruding members, each protruding member coupled to a corresponding one of the arms at a protruding member distance from the outer end of the corresponding arm, wherein pressing the protruding members on the circuit substrate provides a second spring bias on the thermal management apparatus to thermally couple the thermal management apparatus with the heat generating component.

7. The device of claim 6, wherein the first spring bias includes a constant spring rate.

8. The device of claim 6, wherein the second spring bias includes a variable spring rate.

9. The device of claim 6, wherein the protruding member distance relative to a length of the arms defines the second spring bias.

10. The device of claim 9, wherein the protruding member distance is adjustable to vary the second spring bias.

11. The device of claim 6, further comprising a center portion defined by the coupling of inner ends of the plurality of arms, the center portion having a locator pin configured to engage with a corresponding aperture in the circuit substrate.

12. A circuit assembly comprising:
    a circuit substrate having at least one heat generating component;
    at least one thermal management apparatus;
        a device to couple the thermal management apparatus to the heat generating component, the device comprising at least a first portion and at least a second portion coupled to the thermal management device, wherein the first portion and the second portion provide a first spring bias on the thermal management apparatus to thermally couple the thermal management apparatus with the heat generating component; and
        at least a first protruding member and at least a second protruding member, the first protruding member disposed between the first portion and the circuit substrate at a first protruding member distance from an end portion of the first portion, and the second protruding member disposed between the second portion and the circuit substrate at a second protruding member distance from an end portion of the second portion;
    wherein pressing the protruding members between the first portion and the second portion and the circuit substrate provides a second spring bias on the thermal management apparatus to thermally couple the thermal management apparatus with the heat generating component.

13. The circuit assembly of claim 12, wherein the first spring bias includes a constant spring rate.

14. The circuit assembly of claim 12, wherein the second spring bias includes a variable spring rate.

15. The circuit assembly of claim 12, wherein the protruding member distance relative to a length of the arms defines the second spring bias.

16. The circuit assembly of claim 15, wherein the protruding member distance is adjustable to vary the second spring bias.

17. The circuit assembly of claim 12, further comprising a center portion defined by the coupling of inner ends of the plurality of arms, the center portion having a locator pin configured to engage with a corresponding aperture in the circuit substrate.

18. The circuit assembly of claim 12, wherein the thermal management apparatus comprises a heat sink having a plurality of fins.

19. The circuit assembly of claim 18, wherein the thermal management apparatus further comprises a fan.

20. A method of thermally coupling a thermal management apparatus to at least one heat generating component of a circuit substrate, the method comprising:
    thermally coupling the thermal management apparatus to the heat generating component with a first spring bias;
    maintaining the thermal coupling of the thermal management apparatus to the heat generating component with a second pivot based spring bias when the thermal management apparatus moves relative to the heat generating component; and wherein maintaining the thermal coupling of the thermal management apparatus with the heat generating component is provided by a first protruding member.

21. The method of claim 20, wherein thermally coupling the thermal management apparatus with the heat generating component is provided by a device having at least a first portion and a at least a second portion adapted to couple the thermal management device to the heat generating component.

22. The method of claim 20, wherein the first spring bias includes a constant spring rate.

23. The method of claim 20, wherein the second spring bias includes a variable spring rate.

24. A device to thermally couple a thermal management apparatus to at least one heat generating component of a circuit substrate, the device comprising:

at least a first portion adapted to couple to the thermal management apparatus;

at least a second portion adapted to couple to the thermal management apparatus, the first portion and the second portion symmetrically arranged relative to each other;

wherein the first portion and the second portion are adapted to thermally couple the thermal management apparatus with the heat generating component with a first spring bias;

wherein the first portion and the second portion are adapted to maintain the thermal management apparatus thermally coupled with the heat generating component with a second and pivot based spring bias provided in response to deflection of the device; and a center portion defined by the coupling of inner ends of the first portion and the second portion, the center portion having a locator pin configured to engage with a corresponding aperture in a circuit substrate.

25. A method of thermally coupling a thermal management apparatus to at least one heat generating component of a circuit substrate, the method comprising:

thermally coupling the thermal management apparatus to the heat generating component with a first spring bias;

maintaining the thermal coupling of the thermal management apparatus to the heat generating component with a second pivot based spring bias when the thermal management apparatus moves relative to the heat generating component; and wherein a protruding member distance relative to a length of the arms defines the second spring bias.

26. The method of claim 25, wherein the protruding member distance is adjustable to vary the second spring bias.

* * * * *